US008593163B2

(12) United States Patent
Dorrough (10) Patent No.: US 8,593,163 B2
(45) Date of Patent: Nov. 26, 2013

(54) SURFACE-CONFORMING OBSCURED FEATURE DETECTOR

(75) Inventor: David M. Dorrough, Eagle, ID (US)

(73) Assignee: Franklin Sensors, Inc., Eagle, ID (US)

( * ) Notice: Subject to any disclaimer, the term of this patent is extended or adjusted under 35 U.S.C. 154(b) by 337 days.

(21) Appl. No.: 12/860,448

(22) Filed: Aug. 20, 2010

(65) Prior Publication Data

US 2011/0215818 A1   Sep. 8, 2011

Related U.S. Application Data

(63) Continuation-in-part of application No. 12/826,478, filed on Jun. 29, 2010, now Pat. No. 8,476,912.

(60) Provisional application No. 61/339,316, filed on Mar. 4, 2010, provisional application No. 61/333,252, filed on May 10, 2010, provisional application No. 61/345,591, filed on May 17, 2010.

(51) Int. Cl.
*G01R 27/26* (2006.01)
*G01R 19/00* (2006.01)
*G01V 3/10* (2006.01)

(52) U.S. Cl.
USPC ............. 324/679; 324/67; 324/329; 324/687; 324/671; 324/690

(58) Field of Classification Search
USPC ....................... 324/661, 679, 672, 66, 67, 664
See application file for complete search history.

(56) References Cited

U.S. PATENT DOCUMENTS

| 4,099,118 | A | | 7/1978 | Franklin et al. |
| 4,422,035 | A | * | 12/1983 | Risko ............................ 324/671 |
| 4,464,622 | A | | 8/1984 | Franklin |
| 4,853,617 | A | * | 8/1989 | Douglas et al. ................. 324/67 |
| 4,992,741 | A | | 2/1991 | Douglas et al. |
| 5,214,388 | A | | 5/1993 | Vranish et al. |
| 5,325,442 | A | | 6/1994 | Knapp |
| 5,352,974 | A | | 10/1994 | Heger |
| 5,619,128 | A | | 4/1997 | Heger |
| 5,682,032 | A | | 10/1997 | Philipp |
| 5,730,165 | A | | 3/1998 | Philipp |

(Continued)

FOREIGN PATENT DOCUMENTS

EP   1622266 A1   2/2006

OTHER PUBLICATIONS

US Patent and Trademark Office; Office Action for U.S. Appl. No. 13/040,226 dated Jun. 14, 2013.

(Continued)

*Primary Examiner* — Jermele M Hollington
*Assistant Examiner* — Christopher McAndrew
(74) *Attorney, Agent, or Firm* — Parsons Behle & Latimer (57) ABSTRACT

A surface-conforming obscured feature detector includes a plurality of sensor plates flexibly connected together, each having a capacitance that varies based on the dielectric constant of the materials that compose the surrounding objects and the proximity of those objects. A sensing circuit is coupled to the sensor plates to measure the capacitances of the sensor plates. A controller is coupled to the sensing circuit to analyze the capacitances measured by the sensing circuit. One or a plurality of indicators are coupled to the controller, and are selectively activated to identify the location of a relative high capacitance, which can be indicative of an obscured feature behind a surface.

18 Claims, 9 Drawing Sheets

(56) References Cited

U.S. PATENT DOCUMENTS

| | | | |
|---|---|---|---|
| 5,773,971 A | 6/1998 | Tavernetti | |
| 5,812,057 A | 9/1998 | Hepworth et al. | |
| 5,844,486 A | 12/1998 | Kithil et al. | |
| 5,917,314 A | 6/1999 | Heger et al. | |
| 6,023,159 A | 2/2000 | Heger | |
| 6,152,514 A | 11/2000 | McLellen | |
| 6,198,271 B1 | 3/2001 | Heger et al. | |
| 6,201,400 B1 * | 3/2001 | Lind | 324/687 |
| 6,211,662 B1 | 4/2001 | Bijawat et al. | |
| 6,215,293 B1 | 4/2001 | Yim | |
| 6,249,113 B1 * | 6/2001 | Krantz et al. | 324/67 |
| 6,259,241 B1 | 7/2001 | Krantz | |
| 6,288,707 B1 | 9/2001 | Philipp | |
| 6,370,965 B1 | 4/2002 | Knapp | |
| 6,377,009 B1 | 4/2002 | Philipp | |
| 6,446,012 B1 | 9/2002 | Macke, Sr. et al. | |
| 6,452,514 B1 | 9/2002 | Philipp | |
| 6,457,355 B1 | 10/2002 | Philipp | |
| 6,466,036 B1 | 10/2002 | Philipp | |
| 6,501,414 B2 | 12/2002 | Arndt et al. | |
| 6,535,200 B2 | 3/2003 | Philipp | |
| 6,844,713 B2 | 1/2005 | Steber et al. | |
| 6,894,505 B2 | 5/2005 | Gohel | |
| 6,989,662 B2 | 1/2006 | Heger et al. | |
| 6,993,607 B2 | 1/2006 | Philipp | |
| 6,998,854 B2 | 2/2006 | Yamagishi | |
| 7,013,570 B2 | 3/2006 | Levine et al. | |
| 7,106,072 B2 | 9/2006 | Clauss et al. | |
| 7,116,091 B2 | 10/2006 | Miller | |
| 7,148,703 B2 | 12/2006 | Miller | |
| 7,212,014 B2 * | 5/2007 | Krantz | 324/661 |
| 7,256,587 B2 | 8/2007 | Sanoner et al. | |
| 7,288,945 B2 | 10/2007 | Martinez et al. | |
| 7,316,073 B2 | 1/2008 | Murray | |
| 7,368,921 B2 * | 5/2008 | Deangelis et al. | 324/661 |
| 7,409,765 B2 | 8/2008 | So | |
| 2005/0138886 A1 | 6/2005 | Sanoner et al. | |
| 2005/0194959 A1 * | 9/2005 | Miller | 324/67 |
| 2006/0225509 A1 | 10/2006 | Haupt et al. | |
| 2008/0110038 A1 | 5/2008 | Sergyeyenko | |
| 2008/0238403 A1 | 10/2008 | Sanoner et al. | |
| 2008/0289385 A1 | 11/2008 | Megy | |
| 2009/0045808 A1 | 2/2009 | Mano | |
| 2009/0169063 A1 | 7/2009 | Kuraishi | |
| 2011/0215814 A1 | 9/2011 | Dorrough | |
| 2011/0215815 A1 | 9/2011 | Dorrough | |
| 2011/0215816 A1 | 9/2011 | Dorrough | |
| 2011/0215817 A1 | 9/2011 | Dorrough | |
| 2011/0215818 A1 | 9/2011 | Dorrough | |
| 2011/0215819 A1 | 9/2011 | Dorrough | |
| 2011/0215822 A1 | 9/2011 | Dorrough | |

OTHER PUBLICATIONS

US Patent and Trademark Office; Office Action for U.S. Appl. No. 13/040,224 dated Jun. 14, 2013.
US Patent and Trademark Office; Office Action for U.S. Appl. No. 13/040,218 dated Jun. 24, 2013.
US Patent and Trademark Office; Office Action for U.S. Appl. No. 13/040,206 dated Jun. 12, 2013.
US Patent and Trademark Office; Office Action for U.S. Appl. No. 13/040,203 dated Jun. 16, 2013.
US Patent and Trademark Office, Office Action Dated Sep. 17, 2012 for U.S. Appl. No. 12826478.
International Search Report and Written Opinion dated Sep. 15, 2011 for PCT/US2011/027239.

* cited by examiner

SURFACE-CONFORMING OBSCURED FEATURE DETECTOR

CROSS REFERENCE TO RELATED APPLICATIONS

The present application is a continuation-in-part of U.S. Non-Provisional patent application Ser. No. 12/826,478 entitled STATIONARY FEATURE DETECTOR, filed on Jun. 29, 2010 now U.S. Pat. No. 8,476,912. This application also claims the benefit of the following provisional patent applications: U.S. Provisional Patent Application No. 61/339,316, entitled "MATERIAL DETECTOR THAT OPERATES FROM A STATIONARY POSITION" and filed on Mar. 4, 2010; U.S. Provisional Patent Application No. 61/333,252, entitled "MATERIAL DETECTOR THAT OPERATES FROM A STATIONARY POSITION" and filed on May 10, 2010; U.S. Provisional Patent Application No. 61/345,591, entitled "MATERIAL DETECTOR THAT OPERATES FROM A STATIONARY POSITION" and filed on May 17, 2010. The entire contents of these patent applications are incorporated by reference herein.

BACKGROUND

1. Technical Field

The present disclosure relates generally to devices used for detecting the presence of obscured features behind opaque, solid surfaces, more specifically, devices used for locating beams and studs behind walls and joists beneath floors.

2. Background

The need to locate obscured features such as beams, studs, joists and other support elements behind walls and beneath floors is a common problem encountered during construction, repair and home improvement activities. Often a need exists to cut or drill into a supported surface with the aim of creating an opening in the surface while avoiding the underlying support elements. In these instances, it is desirable to know where the support elements are positioned before beginning so as to avoid cutting or drilling into them. On other occasions, one may desire to anchor a heavy object to the obscured support element. In these cases, it is often desirable to install a fastener through the surface in alignment with the underlying support element. However, once the wall, floor or surface is in place, the location of the support element is not visually detectable.

A variety of rudimentary techniques have been employed with limited success to address this problem in the past. These have included driving small pilot nails through the surface until a support element is detected and then covering over holes in the surface that did not reveal the location of the stud or support. A less destructive technique comprises tapping on the surface in question with the aim of detecting audible changes in the sound which emanates from the surface when there is a support element beneath or behind the area being tapped. This technique is not very effective, however, because the accuracy of the results depends greatly on the judgment and skill of the person searching for the support, and because the sound emitted by the tapping is heavily influenced by the type and density of the surface being examined.

Magnetic detectors have also been employed to find obscured support elements with the detector relying on the presence of metallic fasteners, such as nails or screws, in the wall and support element to trigger a response in the detector. However, since metallic fasteners are spaced at discreet locations along the length of a support, a magnetic detector may pass over a length of the support where no fasteners are located, thereby failing to detect the presence of the obscured support element.

Capacitive displacement sensors have also been employed to detect obscured features behind opaque surfaces. These detectors sense changes in capacitance on the examined surface that result from the presence of features positioned behind, beneath or within the surface. These changes in capacitance are detectable through a variety of surfaces such as wood, sheetrock, plaster, gypsum and do not rely on the presence of metal fasteners in the surface or obscured feature for activation of the sensor.

However, conventional capacitive sensors suffer from a number of shortcomings. Conventional detectors typically have a flat detecting surface and don't provide a mechanism to allow the position of sensor plates to accommodate the mild surface curvature that is common to many architectural surfaces. Many architectural surfaces, such as walls and floors, may appear flat upon casual observation. Nevertheless, they often have at least a mild degree of curvature. When a conventional, flat detector is placed on a curved surface, air gaps can emerge between the sensor plates and the detected surface. The readings of the detected surface can differ depending on whether or not an air gap is present. Consequently, air gap inconsistencies can make it more difficult to ascertain the depth and position of hidden features. The signals detected become less consistent and readings may be less reliable. If the surface has too much curvature, it may be difficult, or impossible, to detect hidden features. The problem with air gaps affects conventional capacitive sensing detectors, and may be more significant in larger detectors with more sensor plates and larger sensor plates.

SUMMARY

The present disclosure advantageously addresses one or more of the aforementioned deficiencies in the field of obscured feature detection by providing an accurate, simple to use and inexpensively manufactured obscured feature detector that is conformable to curved or irregular surfaces.

In one embodiment, a surface conforming obscured feature detector comprises a plurality of sensor plates, flexibly connected together, each having a capacitance that varies based on: (a) the proximity of the sensor plate to one or more surrounding objects, and (b) the dielectric constant(s) of the surrounding object(s). The surface conforming obscured feature detector further comprises a sensing circuit coupled to the sensor plates, the circuit being configured to measure the capacitances of the sensor plates, a controller coupled to the sensing circuit, the controller being configured to analyze the capacitances measured by the sensing circuit, and one or a plurality of indicators coupled to the controller, each indicator capable of toggling between a deactivated state and an activated state. The controller is configured to activate one or more of the indicators to identify a location of an obscured feature.

In another embodiment, a surface-conforming obscured feature detector is configured to be placed against a surface to detect the presence of one or more features obscured by the surface. The surface-conforming obscured feature detector comprises a housing with a handle, and a plurality of flexibly interconnected sensor plates coupled to the housing, each sensor plate having a capacitance that varies based on: (a) the proximity of the sensor plate to one or more surrounding objects, and (b) the dielectric constant of the surrounding object(s). The surface-conforming obscured feature detector further comprises a sensing circuit coupled to the sensor plates, the circuit being configured to measure the capacitances of the sensor plates, a controller coupled to the sensing circuit, the controller being configured to analyze the capacitances measured by the sensing circuit, and one or a plurality of indicators coupled to the controller, each indicator capable of toggling between a deactivated state and an activated state. The controller is configured to activate one or more of the indicators to identify a location of an obscured feature.

In another embodiment, a method is provided for detecting an obscured feature behind a surface with a surface-conforming obscured feature detector having a plurality of sensor plates that are flexibly connected together in an array. The method comprises placing the surface-conforming obscured feature detector against the surface such that the array of sensor plates conforms to the surface, and measuring the capacitance of one or a plurality of the sensor plates. The method further comprises identifying, based on the capacitance readings, a location of the obscured feature behind the surface, and activating one or more indicators to indicate the location of the obscured feature behind the surface.

In some embodiments the surface-conforming obscured feature detector comprises a flexible substrate, supporting the sensor plates. In some embodiments the flexible substrate comprises a printed circuit board. In some embodiments the flexible substrate comprises a rigid flex printed circuit board. In some embodiments the surface-conforming obscured feature detector comprises a housing, and a flexible medium disposed between the housing and the sensor plates.

In some embodiments the flexible medium comprises foam rubber. In some embodiments the flexible medium comprises one or a plurality of springs. In some embodiments the flexible connection between sensor plates comprises a printed circuit board.

In some embodiments the sensor plates comprise regions of metal on a flexible printed circuit board. In some embodiments all the sensor plates are mounted on a common printed circuit board. In some embodiments a flexible medium is disposed between the sensor plates and the housing.

In some embodiments at least one sensor plate is disposed upon a first printed circuit board, and at least one sensor plate disposed upon a second printed circuit board. In some embodiments one or more sensor plates pivot on a hinge. In some embodiments the sensor plates comprise regions of metal on a first flexible substrate, and further comprise a first flexible medium, disposed between the first flexible substrate and the housing. In some embodiments the sensor plates further comprise regions of metal on a second flexible substrate, and further comprise a second flexible medium, disposed between the second flexible substrate and the housing.

In some embodiments, the housing of the detector is flexible. In some embodiments the step of placing the surface-conforming obscured feature detector against the surface comprises causing the array of sensor plates to flex with respect to curvature of the surface. In some embodiments, placing the surface-conforming obscured feature detector against the surface comprises flexing the array of sensor plates to conform to a concave or convex curvature of the surface.

In another embodiment, the sensor plates are disposed upon first and second printed circuit boards, which can move independently.

A novel and non-obvious feature of the surface-conforming obscured feature detector is the ability to detect features through convex, concave, and flat surfaces.

A novel and non-obvious feature of the surface-conforming obscured feature detector is the ability to provide more consistent readings. Inconsistent air gaps between sensor plates and the examined surface can cause readings to be less reliable.

A novel and non-obvious feature of the surface-conforming obscured feature detector is ability to detect features more deeply and to more accurately determine the position of an obscured feature. By removing the error in the readings caused by inconstent air gaps, deeper and more accurate readings can be made of the examined surface.

A novel and non-obvious feature of the surface-conforming obscured feature detector is ability more accurately detect obscured features through materials with inconsistent densities. Construction materials often have density inconsistencies. When error due to material consistency is combined with error due to air gaps, there is less margin to detect features.

A novel and non-obvious feature of the surface-conforming obscured feature detector is the capability to create large detectors. Conventional detectors have sensor plates that are rigidly connected together, and as a result the size of obscured feature detectors typically remains relatively small to function on the curved surfaces that are typical of many architectural surfaces. However as the size of detectors increases, the size of air gaps increases, and their ill-effects increase. The surface-conforming feature detector conforms to the contour of the surface, minimizes air gaps, and makes it possible to build larger feature detectors that can offer a variety of performance improvements.

A novel and non-obvious feature of the surface-conforming obscured feature detector is the ability to better distinguish between architectural features such as a beams, joists, or studs, that would pressummably produce a comparatively larger capacitive reading than a pipe or wire that would be further from the surface, and have a weaker capacitive reading. More accurate readings improve the ability to discriminate between different features.

A novel and non-obvious feature of the surface-conforming obscured feature detector is the ability to detect obscured features without requiring the user to learn special techniques, such as performing the detection multiple times and averaging the results from multiple readings, to determine the position of obscured features on irregular surfaces.

The present disclosure will now be described more fully with reference to the accompanying drawings, which are intended to be read in conjunction with both this summary, the detailed description, and any preferred or particular embodiments specifically discussed or otherwise disclosed. This disclosure may, however, be embodied in many different forms and should not be construed as limited to the embodiments set forth herein; rather, these embodiments are provided by way of illustration only so that this disclosure will be thorough, and fully convey the full scope of the invention to those skilled in the art.

DETAILED DESCRIPTION

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention, and it is to be understood that modifications to the various disclosed embodiments may be made, and other embodiments may be utilized, without departing from the spirit and scope of the present invention. The following detailed description is, therefore, not to be taken in a limiting sense.

To provide context for the disclosure it may be useful to understand how capacitance is used to detect obscured features behind a surface. Capacitance is an electrical measure of an object's ability to hold or store charge. A common form of an energy storage device is the parallel plate capacitor whose capacitance is calculated by: $C = \varepsilon_r \varepsilon_o A/d$, where A is the overlapping area of the parallel plates, d is the distance between the plates and $\varepsilon_r$ is the relative static permittivity, or dielectric constant of the material between the plates. $\varepsilon_o$ is a constant. The dielectric constant ($\varepsilon_r$) of air is one, while most solid non-conductive materials have a dielectric constant greater than one. Generally, the increased dielectric constants of non-conductive solids enable conventional capacitive displacement sensors to work.

In their most rudimentary form, capacitive sensors are in part single-plate capacitive sensors. These single-plate capacitive sensors use the environment surrounding them as the dielectric where the second plate can be assumed to be infinitely far away. The plates will also form capacitors with other metal plates. When two plates are positioned against a wall, they are not facing each other as is suggested by the definition of a capacitor. Nonetheless, the stray fields emanating from the edges of each of the adjacent plates do extend into the wall and behind it, and curve back to the adjacent plate, allowing the two plates to sense the capacitance of the surface and the space behind the surface.

When the plates are placed on a wall at a location with no support behind the wall, the detector measures the capacitance of the wall and the air behind it. When placed in a position having a support behind the wall, the detector then measures the capacitance of the wall and the support, which has a higher dielectric constant than air. As a consequence, the detector registers an increase in capacitance which can then be used to trigger an indicating system.

This description of feature sensing through capacitive sensing is provided in order to facilitate an understanding of the disclosure. Persons of skill in the art will appreciate that the scope and nature of the disclosure is not limited by the description provided.

The present disclosure is directed to an obscured feature detector. In the exemplary embodiments illustrated in FIGS. 1-7, the obscured feature detector 10 comprises a sensor plate array 31 (see FIG. 2), a multi-layer printed circuit board 40 (see FIGS. 5, 9, 10), a charging and sensing circuit 30 (see FIG. 3), a controller 60 (see FIGS. 3-5), a display circuit 50 (see FIG. 3), a plurality of indicators 52 (see FIGS. 1, 3, 5), a power controller 20 (see FIG. 3) a housing 12 (see FIGS. 1, 5, 9, 10).

Figure 2:
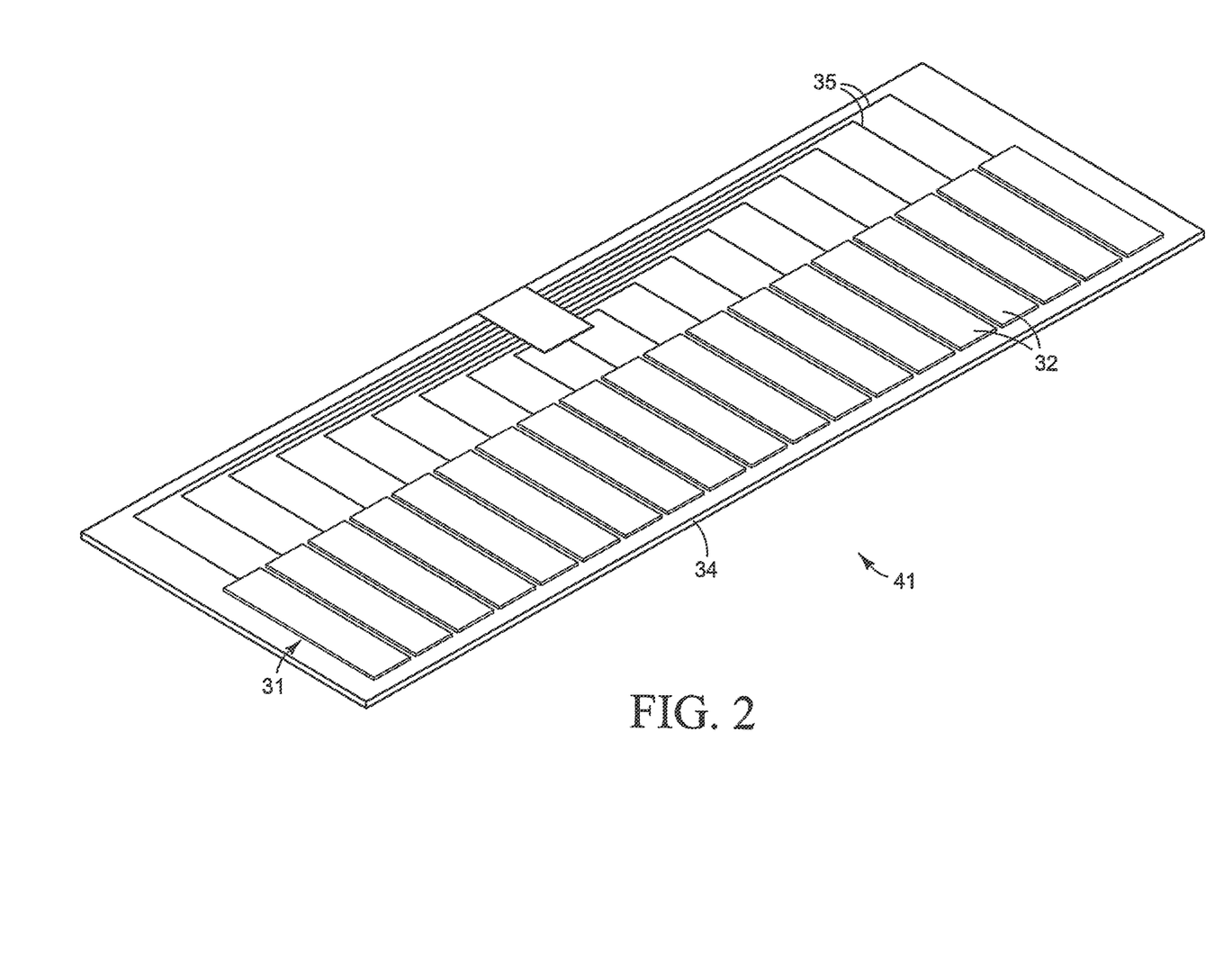
FIG. 2 is a perspective view of a sensor plate array suitable for use with an obscured feature detector.

In some embodiments, as shown in FIG. 2, the sensor plate array 31 comprises two or more sensor plates 32 arranged in a planar array. Each sensor plate 32 has a capacitance that varies based on: (a) the proximity of the sensor plate 32 to one or more surrounding objects, and (b) the dielectric constant(s) of the surrounding object(s). Thus, by evaluating the capacitances of the sensor plates 32, the sensor plate array 31 is capable of sensing the presence and location of one or more features 82 obscured by a surface 80 (see FIG. 6) in contact or proximity with the obscured feature detector 10.

The sensor plates 32 can be positioned side by side in a linear arrangement so that a longitudinal axis of the array 31 is substantially perpendicular to a longitudinal axis of the individual sensor plates 32. The individual plates 32 can comprise thin, conductive surfaces and can be manufactured using a variety of suitable techniques, such as, for example, depositing conductive ink on a substrate 34 or applying thin sheets of conductive material to the substrate 34.

Figure 5:
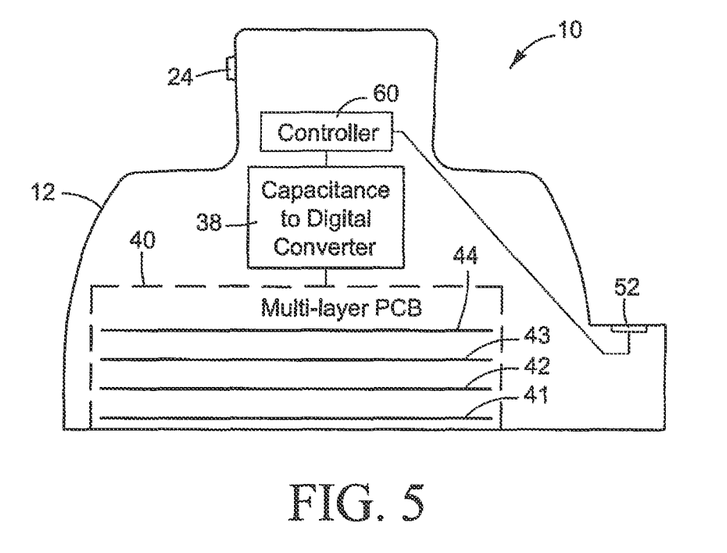
FIG. 5 is a cross sectional view of an obscured feature detector with a block diagram of a charging and sensing circuit projected on the cross-section.
Figure 6:
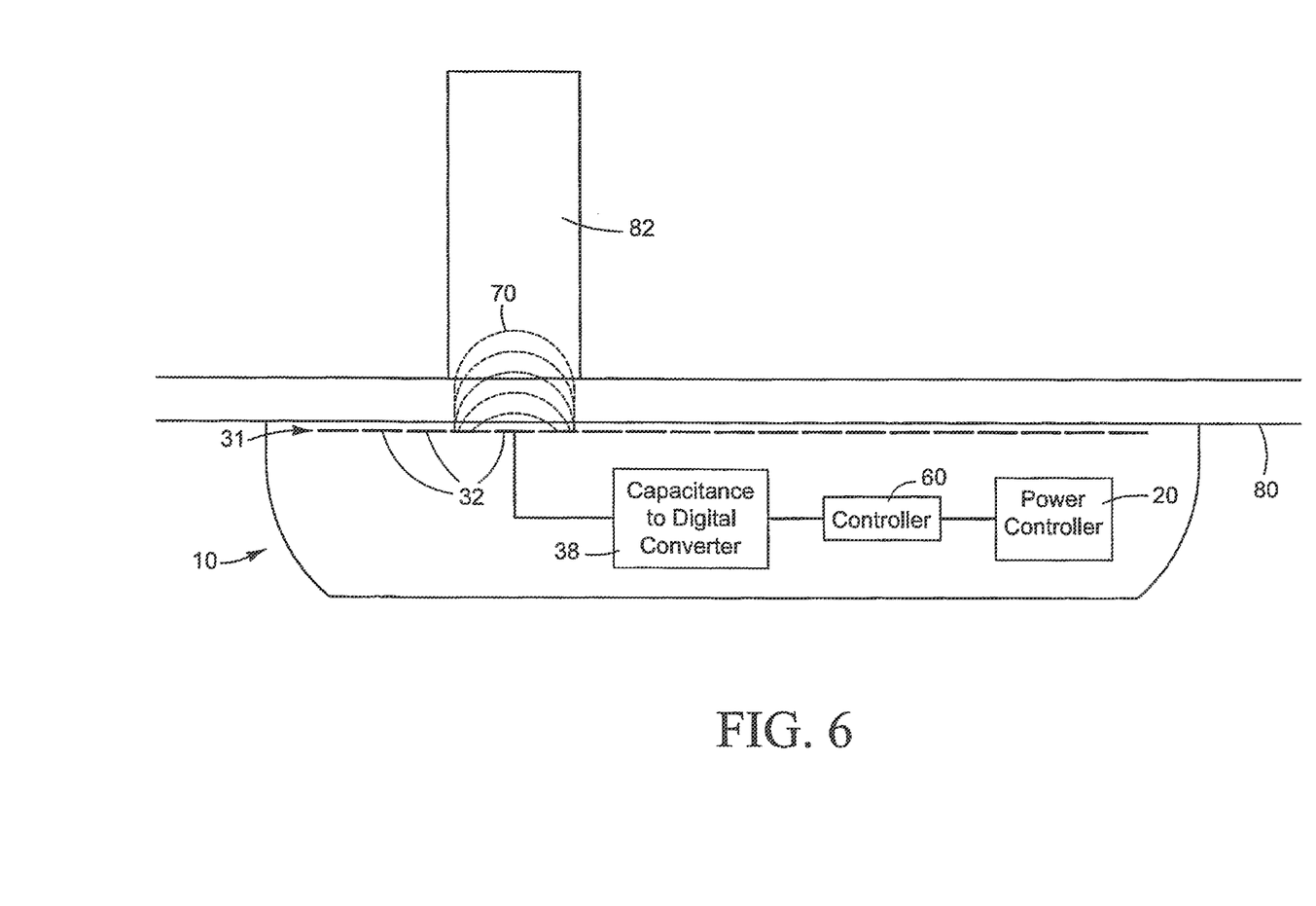
FIG. 6 is a cross sectional view of an obscured feature detector while in use on an examined surface having an obscured feature.
Figure 7:
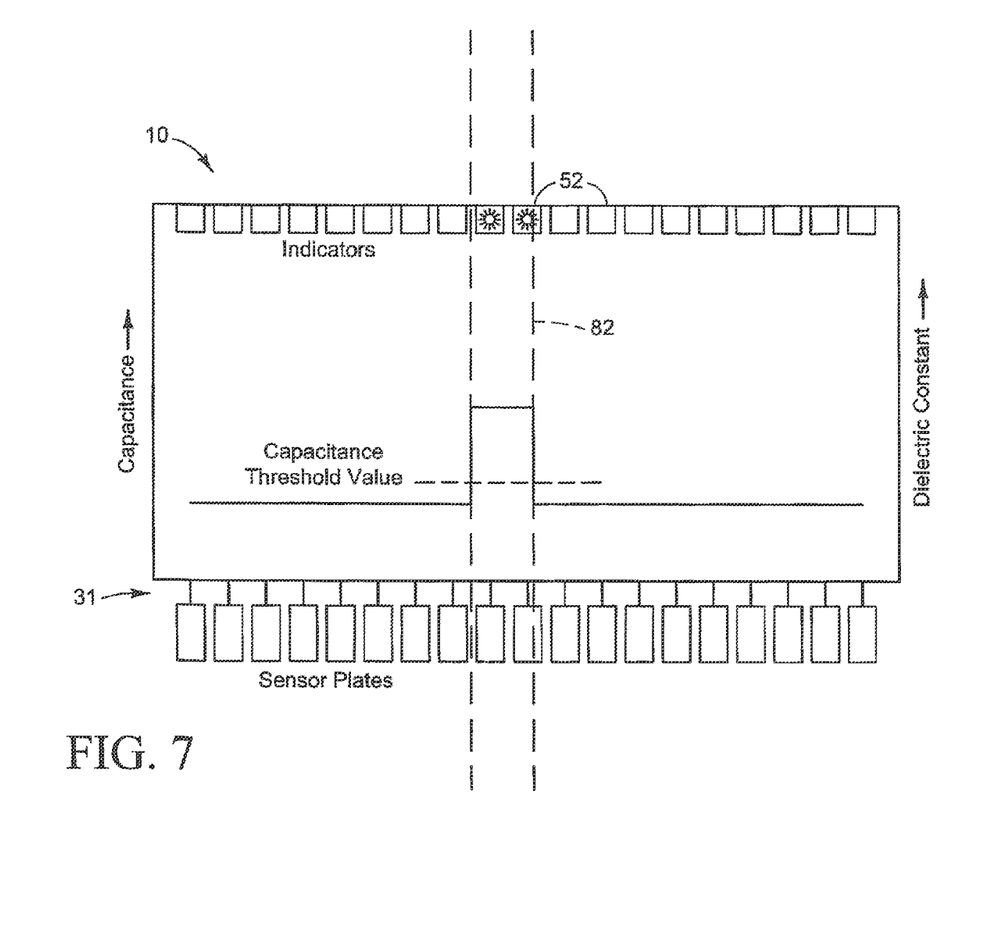
FIG. 7 illustrates the response of the indicators of an obscured feature detector to the increased capacitance caused by the detection of an obscured feature.

In some embodiments, each individual sensor plate 32 of the array 31 is independently connected to the charging and sensing circuit 30 (see FIG. 3), and the array 31 itself is attached to the exposed side of the bottom layer 41 of the printed circuit board 40 which is positioned facing the underside of the detector 10 (see FIG. 5). In some embodiments, the obscured feature detector 10 has at least four sensor plates 32, which advantageously enables the obscured feature detector 10 to detect the full width of a common obscured feature 82, such as a stud, from a stationary position. By contrast, many existing stud detectors with fewer than four sensor plates cannot detect the full width of a stud without being moved.

In some embodiments, as shown in FIG. 5, the printed circuit board 40 comprises a multi-layer board with a bottom layer comprising a sensor board 41 on which the sensor plate array 31 is placed, two middle layers comprising a power plane board 42 and a ground plane board 43 respectively, and a top layer comprising a metal shielding board 44. In other embodiments the sensor plate array 31 can be placed on a middle layer of the printed circuit board 40 to provide an insulating layer to protect the circuits from static discharge. Placing the sensor plates 32 on a middle layer can have the added benefit of minimizing the expansions and contractions of the sensor plates 32 as the printed circuit board 40 is flexed.

Figure 9:
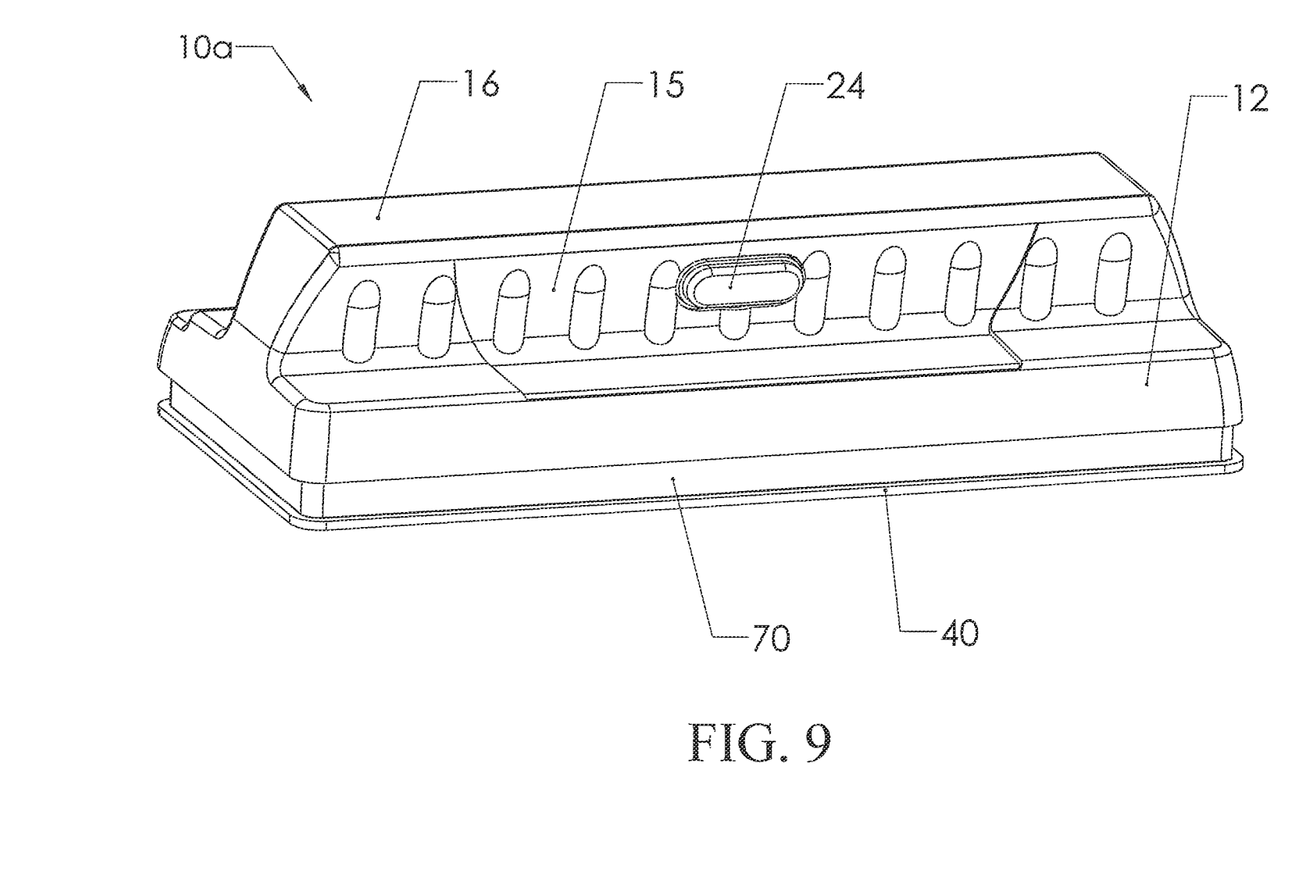
FIG. 9 is a surface-conforming obscured feature detector that has all the sensor plates on a single printed circuit board.
Figure 10:
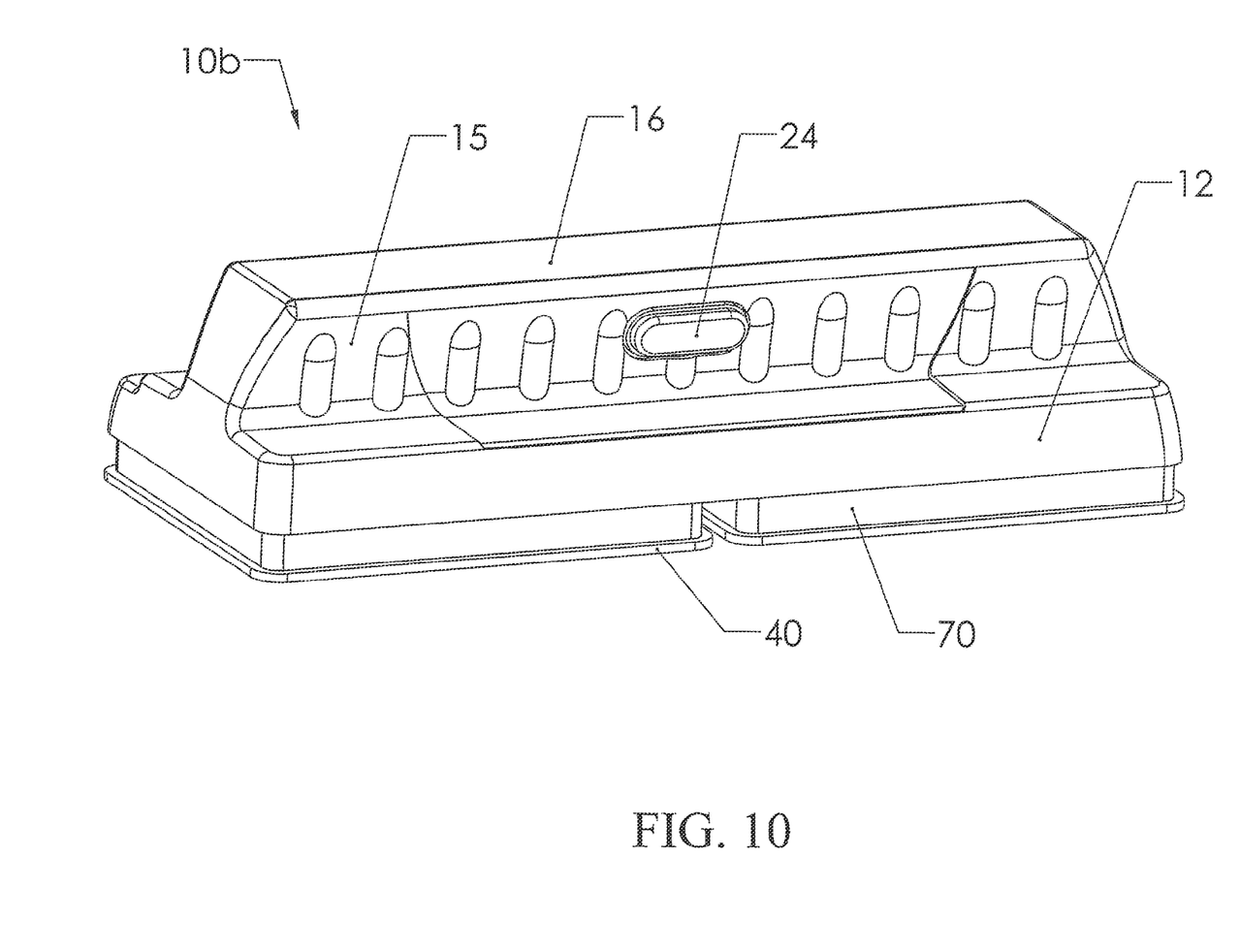
FIG. 10 is a surface-conforming obscured feature detector that uses two printed circuit boards. Half of the sensor plates are on a first printed circuit board, and half of the sensor plates are on a second printed circuit board.

In some embodiments, the printed circuit board 40 can be external to the material detector housing 12 and the circuits are only protected by the external layer, or layers, of the printed circuit board 40, as illustrated in FIGS. 9, 10. The printed circuit board 40 can be made from a variety of suitable materials, such as, for example, FR-4, FR-406, or more advanced materials used in radio frequency circuits, such as Rogers 4003C. Rogers 4003C may offer improved temperature stability. In the embodiment illustrated in FIG. 5, the printed circuit board 40 is positioned inside the housing 12 with the sensor board 41 containing the sensor plate array 31 oriented toward the underside of the obscured feature detector 10 and the shielding board 44 positioned as the top layer of the printed circuit board 40 immediately beneath the housing 12.

Figure 3:
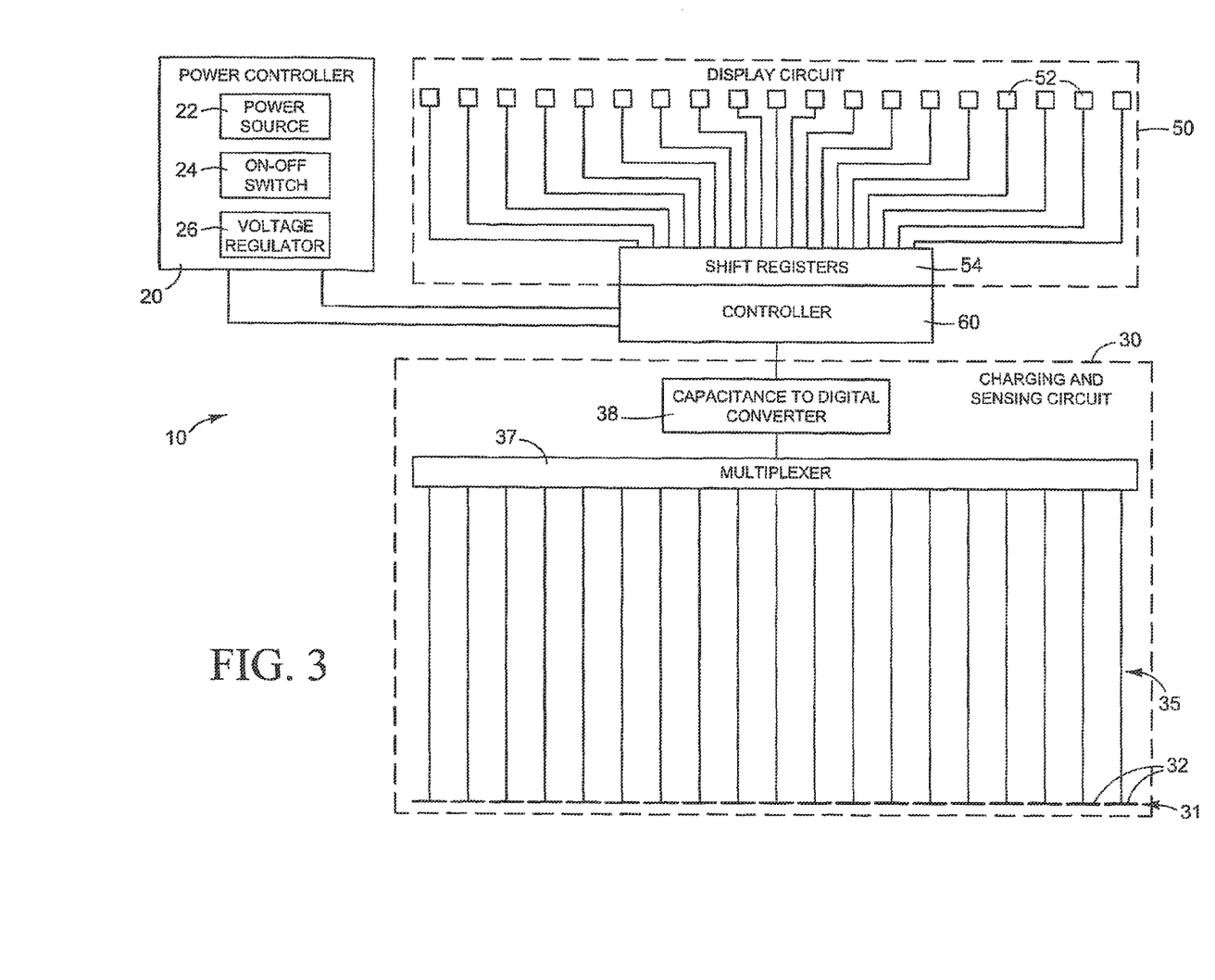
FIG. 3 is a block diagram of certain functional components of an obscured feature detector.

In some embodiments, as shown in FIG. 3, the charging and sensing circuit 30 comprises a plurality of electrical traces 35, a multiplexer 37, and a capacitance-to-digital converter 38. The charging and sensing circuit 30 can be connected to the controller 60. In some embodiments, each of the electrical traces 35 between the controller 60 and the sensor plates 32 have substantially the same length and width. As a result, the traces 35 have substantially similar electrical properties (resistance, capacitance, and inductance) and substantially similar response to environmental conditions, such as temperature. The electrical traces 35 can comprise conductive paths on the printed circuit board 40, which connect the individual sensor plates 32 to the input port of the controller 60. As a result, the sensor plates 32 can be individually connected to the charging and sensing circuit 30.

Figure 4:
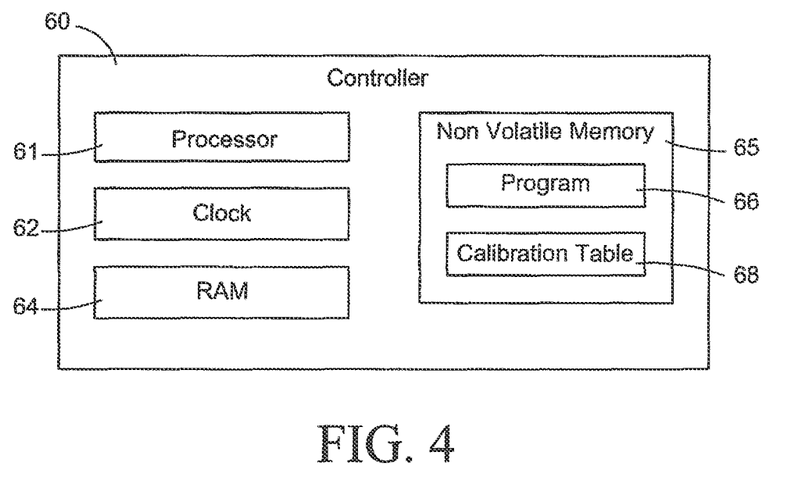
FIG. 4 is a block diagram of a controller suitable for use with an obscured feature detector.

In some embodiments, as shown in FIG. 4, the controller 60 comprises a processor 61, a clock 62, a random access memory (RAM) 64, and a non-volatile memory 65, In operation, the controller 60 receives programmable code 66 and synchronizes the functions of the charging and sensing circuit 30 with the display circuit 50 (see FIG. 3). The clock 62, which can be integrated into the controller 60, times and switches the connection of the individual sensor plates 32 to the charging and sensing circuit 30. The non-volatile memory 65 receives and holds the programmable code 66 as well as look-up tables (LUT) and calibration tables 68. The programmable code 66 can include number of suitable algorithms, such as, for example, an initialization algorithm, a calibration algorithm, a base-lining algorithm, a charging and sensing algorithm, a proximal sensor zeroing algorithm, a multiplexing algorithm, a display management algorithm, an active sensor activation algorithm, and a non-active sensor management algorithm.

In some embodiments, as shown in FIG. 3, the display circuit 50 comprises a plurality of shift registers 54 and a plurality of indicators 52. The shift registers 54 can be connected in series between the controller 60 and the indicators 52. In operation, the shift registers 54 can transmit state change signals generated by the controller 60 to an indicator 52 corresponding to a sensor plate 32 that detects a capacitance level indicating the presence of a feature 82 (see FIG. 6), such as a stud or support. The indicators 52 can comprise LEDs, LCD displays, incandescent bulbs, or other suitable indicators. In the embodiments illustrated in FIG. 1 the indicators 52 are positioned in receptacles 18 in the backside of the housing 12 in one or more linear arrays, with each individual indicator 52 aligned with a corresponding sensor plate 32 to which the indicator 52 is connected through the display circuit 50.

Figure 1:
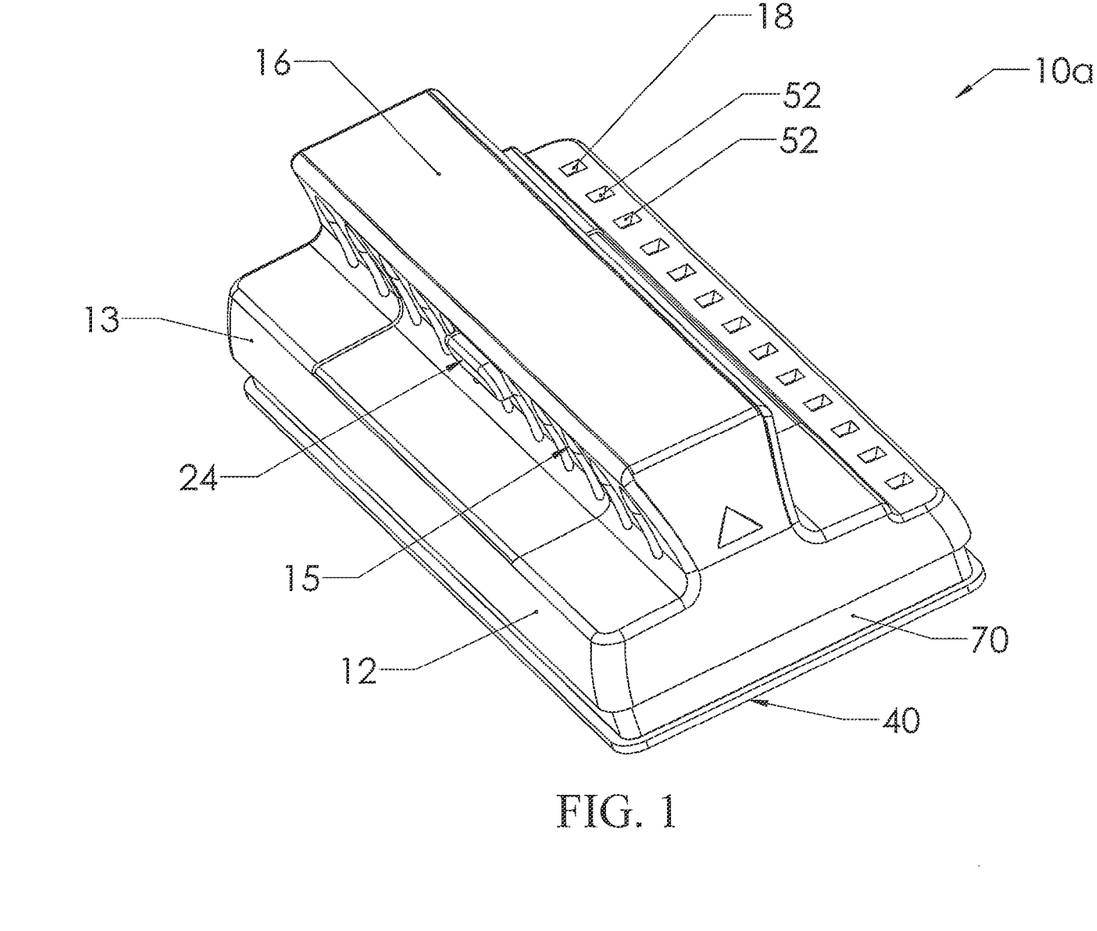
FIG. 1 illustrates a perspective view of a first embodiment of an obscured feature detector.

In some embodiments, as shown in FIGS. 1, 9 and 10 the housing 12 comprises an upper housing 13, an on/off switch 24, a handle 15, a plurality of receptacles 18 and a power supply compartment 16. The upper housing 13 can contain the multi-layered printed circuit board 40, the charging and sensing circuit 30, the display circuit 50, and the controller 60 in an interior cavity. In some embodiments, the housing 12 can be made of a variety of dielectric materials, including but not limited to ABS plastic, PVC, acetyl, or nylon.

In some embodiments, the handle 15 comprises a gripping surface positioned orthogonally from the back plane of the upper housing 13. The handle 15 is preferably positioned so that the user's hand does not obscure the view of the indicators 52 when grasping the handle 15. In some embodiments, the power supply compartment 16 comprises a cavity for holding a suitable power supply, such as batteries or a fuel cell, and a cover for accessing the compartment 16.

In some embodiments, as shown in FIG. 3, the obscured feature detector 10 comprises a power controller 20 having a power source 22, an on-off switch 24, and a voltage regulator 26. The power source 22 can comprise an energy source for charging the sensor plates 32, powering the indicators 52, and supplying power to the capacitance charging and sensing circuit 30, the controller 60 and the display circuit 50. In some embodiments, the power source 22 can comprise a DC battery supply or an AC adapted power supply. The on-off switch 24 can be used to activate the sensor plate array 31 and other components of the obscured feature detector 10 when it is placed on or near a surface 80, as described above. In some embodiments, the on-off switch 24 comprises a push button mechanism that activates components of the obscured feature detector 10 for a selected time period. In some embodiments the on-off switch 24 comprises a capacitive sensor that can sense the presence of a finger, or thumb over the button. In some embodiments, the on-off switch 24 can comprise a toggle switch, or other types of buttons or switches. The voltage regulator 26 can be used to condition the output of the power controller 20, as desired.

In operation, the charging and sensing circuit 30 can implement a capacitance-to-digital conversion process. As an initial step, the obscured feature detector 10 can be placed in a stationary position against a surface 80 to be examined and activated using the on-off switch 24, as described above. The charging and sensing circuit 30 may then individually charge a first sensor plate 32 of the obscured feature detector 10. In subsequent iterations of the capacitance-to-digital conversion process, additional sensor plates 32 in the sensor plate array 31 can be charged sequentially by the charging and sensing circuit 30. In some embodiments, to maintain appropriate levels of sensitivity, non-active sensor plates 32 (e.g., those not connected to the charging and sensing circuit 30 at any given moment), are positively controlled by a suitable method, such as allowing them to float in a high-impedance state, driving them to ground potential, or driving them to the same potential as the shielding board 44 of the multi-layer PCB 40.

Once a first sensor plate 32 has been charged, the charging and sensing circuit 30 allows the charged sensor plate 32 to share the charge with a modulation capacitor, which may be connected to the sensor plate 32 in series through a modulation resistor. The voltage of the modulation capacitor can then be measured and compared against a reference voltage. The charge sharing process is repeated iteratively until the voltage on the modulation capacitor reaches the reference voltage. In some embodiments, the controller 60 counts the number of iterations that occur before the modulation capacitor reaches the reference voltage. This count indicates the capacitance of the sensor plate 32, with lower counts corresponding to greater capacitances. Once the capacitance of the first sensor plate 32 has been determined, the capacitance-to-digital conversion process can be repeated sequentially for the remaining sensor plates 32 to determine their respective capacitances.

Figure 8:
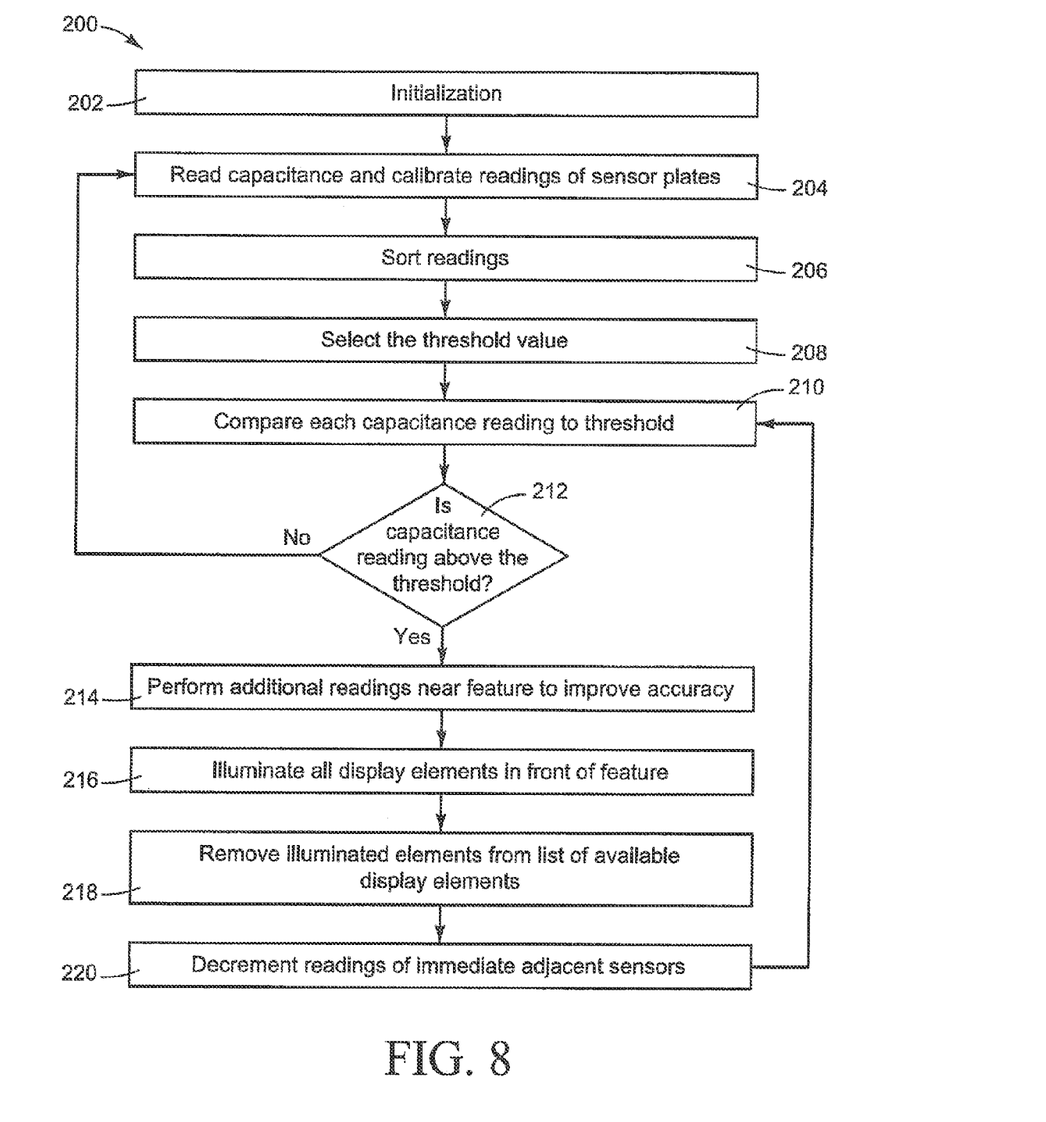
FIG. 8 is a flow diagram showing a feature detection process implemented in some embodiments of an obscured feature detector.

FIG. 8 is a flow diagram showing a feature detection process 200 implemented in some embodiments of the obscured feature detector 10. The detection process 200 begins with a first step 202, in which the obscured feature detector 10 is initialized and/or calibrated. In some embodiments, initialization occurs automatically after the obscured feature detector 10 is turned on. Calibration can advantageously compensate for differences in the sensor plates 32, such as differences in dielectric constant, plate size and trace length, all of which can have an effect on the accuracy of the readings. In some embodiments, a two-dimensional calibration table 68 is applied to the sensor plates 32, which enables them to produce similar readings in response to similar capacitive loads. In some embodiments, the two-dimensional calibration table 68 compensates for temperature variations and may provide separate temperature calibration depending on the sensed capacitive load.

Referring again to FIG. 8, in a next step 204, the capacitance of each sensor plate 32 is measured individually. In a next step 206, the controller 60 sorts the measured capacitance readings in ascending or descending order to determine the relative capacitance values of the individual sensor plates 32. In a step 208, the controller 60 analyzes the sorted capacitance values of the sensor plates 32 to identify one or more regions of relative high capacitance and relative low capacitance in the area of the sensor plates 32. In some embodiments, the controller determines an appropriate threshold value, or baseline, indicating the presence of a possible obscured feature 82. This process, sometimes referred to as base-lining, can "teach" the obscured feature detector 10 what the capacitive load of the examined surface 80 is, so it can factor out that load when evaluating signals. For example, in some embodiments, the controller 60 may select the third lowest capacitance measurement as the threshold, or baseline, value.

In a step 210, the calibrated capacitance of the sensor plate 32 with the highest capacitance reading is compared against the selected threshold value. In a decision step 212, a determination is made as to whether this highest calibrated capacitance reading exceeds the threshold value. If not, processing returns to step 204, and the intervening steps are repeated until at least one sensor plate 32 reaches a calibrated capacitance reading that exceeds the selected threshold value. Once the results of decision step 212 indicate that the maximum capacitance reading exceeds the threshold, then in a step 214, the charging and sensing circuit 30 performs additional capacitance readings of the sensor plates 32 near the one reporting the highest capacitance. These additional measurements advantageously enable the obscured feature detector 10 to determine the location of the feature 82 more precisely. In a next step 216, the appropriate indicators 52 are illuminated to indicate the location of the obscured feature 82 to the user. For example, in some embodiments, the controller 60 transmits a signal through the shift registers 54 of the display circuit 50 to activate the indicators 52 that correspond to the sensor plates 32 registering capacitance values that indicate the presence of the obscured feature 82.

In some embodiments, the differences in capacitance readings between adjacent regions are compared to identify the boundaries between high capacitance regions and low capacitance regions. Once the boundaries between high capacitance regions and low capacitance regions are identified, then indicators are illuminated over the high capacitance regions.

In some embodiments, the capacitance readings are compared to pre-identified patterns to identify the location of obscured features 82. In one example of one particular pattern, a region of three high capacitance readings surrounded by low capacitance readings is used to identify the location of a single object about one and half inches wide, that may correspond to a stud. In another example of a particular pattern, a region of six high capacitance readings surrounded by low capacitance regions is used to identify the location of an object about three inches wide, that may correspond to the location of two studs located side by side.

In some embodiments, algorithms use triangulation to locate one or more obscured features 82. In such embodiments, an assumption is typically made that the distance to an object is inversely proportional to the capacitance reading. Using this assumption, the location of an obscured feature 82 can be determined by using a triangle with the known location of two sensor plates 32 and the inverse of the capacitance readings as the vertices of the triangle.

In other embodiments, different algorithms are utilized that use capacitance readings in other ways to identify the location of obscured features 82. In some embodiments, various combinations of different algorithms are utilized to identify the location of obscured features 82.

Referring again to FIG. 8, in a next step 218, the illuminated indicators 52 are eliminated from the list of available display elements. In a step 220, the controller 60 decrements the capacitance readings of sensor plates 32 adjacent to those indicating the presence of the obscured feature 82. These decrementing adjustments are made to reduce the possibility of a "false positive" indication of an additional obscured feature 82. In some cases, sensor plates 32 that are near, but not over, an obscured feature 82 will signal an increase in capacitance greater than the selected threshold value. Thus, if no decrementing adjustment is made, the controller 60 may misinterpret those readings as being indicative of an additional obscured feature 82.

Once the decrementing adjustments are made in step 220, processing returns to step 210, at which the obscured feature detector 10 checks for additional obscured features 82 by comparing the highest remaining capacitance measurement against the selected threshold value. The process steps described above are repeated, except that sensor plates 32 already acknowledged by the controller 60 as having detected an obscured feature 82 are not evaluated again. In some embodiments, to minimize electrical noise during the capacitance sensing, the controller 60 does not change the state of the indicators 52 while the charging and sensing circuit 30 is active.

In some embodiments, to improve the signal to noise ratio, adjacent sensor plates 32 can be electrically connected in groups of two, three or more plates in a rolling sweep, thereby effectively increasing the plate size without increasing the overall size of the obscured feature detector 10. For example, in some embodiments, the first, second and third sensor plates 32 can be grouped together and read as one, followed by the second, third and fourth sensor plates 32 being grouped together and read as one, and so on. This grouping can be accomplished by connecting multiple sensor plates to the capacitance-to-digital converter 38 using the multiplexer 37.

Another technique for reducing signal to noise ratio is to read the sensor plates 32 in groups of one, two, three, or more. The groups of sensor plates 32 sampled can be adjacent during some scans, and not adjacent during others. For example, in some embodiments, the second sensor plate 32 is sensed individually, followed by the first, second and third sensor plates 32 being grouped together and sensed as a unit. These two readings are then combined by the controller 60 before adjusting the state of the associated indicators 52.

In some embodiments, differential detection is employed, whereby one group of sensor plates 32 is compared to an alternate group of sensor plates 32. The groups of compared sensor plates 32 may, or may not, be adjacent. Each group of compared sensor plates 32 can comprise one or more sensor plates 32. Many combinations are possible. Those skilled in the art can determine which of the many combinations are most suitable for a desired design. Combining the readings from a variety of different combinations of readings, including both differential and non-differential readings, can provide composite readings that can detect more deeply, with more accuracy, and less noise.

In one particular example, the obscured feature detector 10 comprises nineteen sensor plates 32 arrayed side by side in vertical orientation along the longitudinal axis of the detector 10, with a gap of approximately 1.7 mm between adjacent plates. In this particular example, each sensor plate 32 has a width of about 11 mm wide and a length of about 45 mm. The sensor plates 32 can be manufactured of conductive ink deposited onto the bottom surface 41 of a multi-layer printed circuit board 40. The multi-layered printed circuit board 40 can be selected from a material used to manufacture RF printed circuit boards in order to resist dielectric constant variance and dimensional variances associated with temperature variations.

The capacitance-to-digital conversion process can be accomplished by the AD7147 from Analog Devices. Other controllers that can be used to perform the capacitance-to-digital conversion include the AD7477 from Analog Devices, the PsoC controller CY8C21534 from Cypress Semiconductor, the C8051CF706 from Silicon Laboratories, or others.

The display circuit 50 functions can be performed using the MM74HC164 shift registers from Fairchild Semiconductor. This display circuit 50 transmits a signal from the controller 60 to the indicators 52, which can comprise LEDs arrayed along the back of the upper housing 13 in two parallel rows, with two opposing indicators on either side of the back of the housing corresponding to each of the nineteen sensor plates 32 for a total of 38 indicators 52. The power controller 20 can comprise the MC33375 integrated circuit from On Semi.

The housing 12 can be manufactured from ABS plastic. In order to accommodate the nineteen sensor plates 32, the housing 12 can have a length of about 10" and a width of about 3". A handle 15 running along the longitudinal axis of the upper housing 13 can be designed to be easy to hold while keeping the user's hand about 1" away from the surface of the PCB 40 and at the same time not obscuring the user's line of sight to the rows of indicators 52 positioned on the back side of the upper housing 13. In other embodiments, the user's hand can be less than 1" away from the surface of the PCB 40.

In some embodiments, the housing 12 has a longitudinal axis with a length of at least about 6", which advantageously enables the obscured feature detector 10 to span the full width of a common obscured feature 82, such as a stud, from a stationary position. By contrast, many existing stud detectors are not wide enough to span the full width of a stud without being moved.

In other embodiments, the obscured feature detector 10 can be longer than 16", with about thirty sensor plates 32. Such a configuration can be particularly advantageous, because many structures built according to standard construction methods in the United States have studs spaced 16" apart on center. Thus, whenever an obscured feature detector 10 having a length greater than about 16" is placed against a wall of such a structure, the detector 10 will typically indicate the presence of at least one stud on the first try.

In some embodiments, the obscured feature detector 10 can be operated in different modes. For example, the user can select a first mode suitable for detecting materials with a dielectric constant between about 2 and 6 corresponding to non-conductive construction materials such as wood, or a second mode suitable for detecting conductive construction materials such as metal studs.

In some embodiments, the obscured feature detector 10 has an alternate operating mode that can be selected to search only for the region with the highest capacitance. An algorithm that always displays the highest reading independent of the signal strength can detect hidden objects that would be considered noise level in normal mode.

Advantageously, the present disclosure provides various embodiments of a surface-conforming obscured feature detector. Conventional detectors have sensor plates that are rigidly connected together, and as a result the size of obscured feature detectors typically remains relatively small to function on the curved surfaces that are typical of many architectural surfaces. However, as the size of detectors increase the size of air gaps increases, and their ill-effects increases. The surface-conforming feature detector disclosed herein conforms to the contour of the surface, minimizes air gaps, and makes it possible to build larger feature detectors that can offer a variety of performance improvements. The improvements described in the present disclosure are applicable to both conventional detectors that are relatively small, and to larger feature detectors.

Viewing FIGS. 1, 9 and 10, in some embodiments, the obscured feature detector 10 has one or more flexible printed circuit boards 40 that can bend to match the contour of the surface 80 to be detected. The flexible printed circuit boards comprise a flexible substrate. Other flexible substrates can also be used that can be made of wood, paper, plastic, or other flexible materials. Rigid flex printed circuit boards can also be used.

The one or more printed circuit boards 40 can be flexibly connected to the housing 12 using a flexible medium such as foam rubber, springs, gel, hinges, pivot points, an encapsulated gas such as air, or other suitable compressible or flexible media. In some embodiments the housing 12 is able to flex. In some embodiments the housing 12 is partially flexible. In some embodiments the housing 12 has integrated plastic leaf springs, or other types of springs or features that provide flexibility. In some embodiments of the obscured feature detector 10, the sensor plates 32 can be mounted on a printed circuit board 40 that is mounted external to the housing 12, as seen in FIG. 9 and FIG. 10. The printed circuit board 40 is connected to the housing 12 via a foam rubber ring 70. In one embodiment, the foam rubber ring 70 is about seven millimeters thick and is formed approximately in the shape of a ring that is about six millimeters wide and follows the perimeter of the housing 12. A permanent adhesive can be used to bond the foam rubber ring 70 to the housing 12 and to the printed circuit board 40.

The foam rubber ring 70 is compressible, and the printed circuit board 40 is flexible, allowing the obscured feature detector to conform to curvature and irregularities of a surface against which it is placed. A variety of flexible and/or compressible materials can be suitable for the flexible medium. EPDM foam rubber that is rated for 25% compression under about 1.5 pounds per square inch of pressure can be used. Other types of foam rubber such as polyurethane foam or silicon rubber foam can also be used. It is desirable that the flexible medium attached between the printed circuit board substrate 40 and the housing 12 not be electrically conductive or partially conductive.

FR-4 and Rogers 4003, and other printed circuit board substrates 40 have sufficient flexibility to bend to match the contour of many architectural surfaces. In some embodiments that use FR-4, a variety of FR-4 with a high dielectric breakdown can be used to protect from electrostatic discharge. S1141 from Guangdong Shengyi has a dielectric breakdown of greater than 40 kV/mm which provides good electro-static discharge protection, compared to other versions of FR-4, which offer 20 kV/mm.

In some embodiments a 1.6 mm thick printed circuit board with three layers of copper can be used. The first layer of copper is on the upper surface and all of the electrical components are soldered to this layer. The second layer of copper can be at a position that is 0.4 mm below the first layer of copper, such that there is 0.4 mm of printed circuit board substrate between the first and second layers of copper. The third layer of copper can be at a position that is 0.4 mm below the second layer of copper, such that there is 0.4 mm of printed circuit board substrate between the second and third layers of copper. In some embodiments all the vias can be drilled to connect the three layers of copper.

A final layer of substrate material that is 0.8 mm thick can be placed to cover the third layer of copper. In some embodiments, no holes are drilled through the 0.8 mm thick layer of substrate. The 0.8 mm thick layer of substrate can help protect the circuit from electrostatic discharge. Alternatively, a layer of plastic, or other non-conductive material, can be used to shield the circuit from electrostatic discharge and to physically protect the printed circuit board 40. As yet another alternative, a layer of plastic can be used in addition to a protective layer of circuit board substrate. It is to be understood that the various layers and thicknesses indicated here are only exemplary of one embodiment. Other combinations of layers and thicknesses can also be used.

In some embodiments the sensor plates 32 can be placed on the third layer of copper. A shield to electrically protect the sensor plates 32 from electrical interference from ambient conditions, including the user's hand, can be placed on the first layer of copper.

In some embodiments the traces that link the sensor plates to the capacitance-to-digital converter 38 are placed on the second layer of copper, and shields for the traces are placed on the first and third layers of copper.

In some embodiments each sensor plate 32 can be on its own independent printed circuit board 40. In some embodiments each sensor plate 32 can be individually attached to the housing 12 through a flexible medium such as a spring, or foam rubber. In some embodiments the sensor plates 32 are on plastic, wood, or other appropriate materials.

In some embodiments, the obscured feature detector 10 uses a plurality of printed circuit boards 40 that can each be independently, flexibly connected to the detector housing 12. For example, as shown in FIG. 10, the sensor plates 32 can be mounted on two independent printed circuit boards 40, such that approximately half of the sensor plates 32 are on a first printed circuit board 40a, and approximately half of the sensor plates 32 are on a second printed circuit board 40b. In this way, it may be possible to achieve a design that offers increase surface conforming capability. More than two independent circuit boards can also be used in this way.

In some embodiments, the housing 12 has flexible features that allow the housing 12 to flex or bend to adapt to the contour of a non-flat detecting surface. In one particular example, an obscured feature detector 10 uses two printed circuit boards 40. Each printed circuit board 40 is attached to the housing 12. In this particular example, the housing 12 is able to flex in the center, such that each sensor plate 32 more closely matches the contour of the surface 80 to be detected. In some embodiments, the housing 12 is mostly or entirely flexible.

In some embodiments the integrated circuits that are soldered to the printed circuit board 40 are covered with a layer of epoxy, or another conformal coating which may improve the reliability of solder joints. In some embodiments the integrated circuits that on the printed circuit board 40 are wire bonded to the printed circuit board 40 with chip on board technology. The chip on board technology normally involves the steps of (1) attaching bare die to the printed circuit board 40, (2) wire bonding (electrically connecting signals on the bare die to the printed circuit board 40), and (3) covering the bare die and wire bonds with a coating of epoxy, or other appropriate material. The chip on board technology may improve the reliability of solder joints. In some embodiments, some of the integrated circuits that have solder reliability issues are placed on a printed circuit board that is separate from the printed circuit that contains the sensor plates. In some embodiments all of the integrated circuits and other electronic components are placed a printed circuit board that is separate from the printed circuit board 40 that contains the sensor plates 32.

In some embodiments a ribbon cable is soldered to the printed circuit board 40 with the sensor plates 32 to connect it to a printed circuit board with the integrated circuits. A soldered-down ribbon cable, such as the flat flexible cable from Parlex, may provide a reliable connection between printed circuit boards that experience flexing and bending. In some embodiments integrated circuits that have packages with external leads are used such as QFP packages, TSOP packages, SOIC packages, QSOP packages, or others. Components that have external leads may provide improved the solder joint reliability, as compared to packages without external leads, such as QFN packages, or BGA packages.

In some embodiments, an auto-calibration adjustment mode is provided. The auto-calibration adjustment mode records and stores the capacitive readings from each of the regions. It compares the readings from substantially adjacent regions and determines if one particular sensor plate 32, or region, tends to have higher or lower readings than its adjacent sensor plate(s) 32 or region(s). When a pattern is detected that one particular sensor plate 32 or one particular region consistently has substantially higher or lower readings than adjacent sensor plates 32 or regions, then adjustments are made to the calibration table to correct the abnormality.

In some embodiments, the obscured feature detector 10 can be operated in a first mode suitable for detecting obscured features 82 through a thin surface that may correspond to a thin piece of sheet rock, or a second mode suitable for detecting obscured features 82 through thick surface that may correspond to a thick piece of sheetrock.

In some embodiments, the obscured feature detector 10 can be operated in a first mode suitable for detecting obscured features 82 behind a first surface material with a comparatively higher dielectric constant such as a OSB or plywood, or a second mode suitable for detecting obscured features 82 behind another surface material with a lower dielectric constant such as gypsum sheetrock.

In some embodiments, the obscured feature detector 10 can be operated in a first mode suitable for detecting an obscured feature 82 that is embedded within a material, such as detecting a pipe within concrete, or a second mode suitable for detecting when the obscured feature 82 is located on the other side of a surface 80, such as detecting a stud on the other side of a piece of sheetrock.

In some embodiments, the obscured feature detector 10 level. Levels are typically used to indicate the inclination relative to a horizontal or vertical surface. In one embodiment an indicator provides a numerical value that indicates the angle of the detector 10 relative to a horizontal or vertical surface. In other embodiments a non-numerical, graphical indicator indicates the angle of the detector 10.

In another embodiment a plurality of indicators 52 are used to indicate which end of the detector is higher, or lower, relative to a horizontal surface. In one particular example of this embodiment, if the detector 10 is inclined such that the left side is higher than the right side, then the indicator(s) 52 at the left side are activated. Likewise if the right side of the detector 10 is higher, then the indicators 52 on the right side are activated. As the detector 10 approaches a level position then the activated indicator(s) 52 move toward the center. When the detector 10 becomes level, then the center indicator(s) 52 are activated.

In another embodiment indicators 52 are used to indicate which end of the detector 10 is further left, or further right, relative to a vertical surface. In one particular example of this embodiment, if the lower end is further to the left than the upper side, then the indicator(s) 52 at the lower end are activated. Likewise, if the upper end of the detector 10 is further left then the indicators at the upper end are activated. As the detector approaches a vertical position then the activated indicator(s) 52 move toward the center. When the detector becomes vertical, then the center indicator(s) 52 are activated.

In one embodiment if the detector is closer to being vertical than horizontal then the detector 10 automatically enters a mode that indicates the inclination relative to a vertical surface. Likewise if the detector 10 is closer to being horizontal than vertical, then the detector 10 automatically enters a mode that indicates the inclination relative to a horizontal surface.

In one embodiment of the detector 10 the indicators 52 that are used to detect the position of a obscured features are the same indicators that are used indicate the inclination. In another embodiment one set of indicators is used to indicate the inclination, and a second set of indicators 52 is used to indicate the position of obscured features.

Although the present disclosure is described in terms of certain preferred embodiments, other embodiments will be apparent to those of ordinary skill in the art, given the benefit of this disclosure, including embodiments that do not provide all of the benefits and features set forth herein, which are also within the scope of this disclosure. It is to be understood that other embodiments may be utilized, without departing from the spirit and scope of the present disclosure.

What is claimed is:

1. A surface conforming obscured feature detector comprising:
    a plurality of sensor plates, flexibly connected together upon a flexible substrate that is conformable to curvature and/or irregularities of the a curved surface to be sensed, each sensor plate having a capacitance that varies based on: (a) the proximity of the sensor plate to one or more surrounding objects, and (b) the dielectric constant(s) of the surrounding object(s);
    a sensing circuit coupled to the sensor plates, the circuit being configured to measure the capacitances of the sensor plates;
    a controller coupled to the sensing circuit, the controller being configured to analyze the capacitances measured by the sensing circuit;
    one or a plurality of indicators coupled to the controller, each indicator capable of toggling between a deactivated state and an activated state, wherein the controller is configured to activate one or more of the indicators to identify a location of an obscured feature behind the curved surface.

2. The surface-conforming obscured feature detector of claim 1, wherein the flexible substrate comprises a printed circuit board.

3. The surface-conforming obscured feature detector of claim 1, wherein the flexible substrate comprises a rigid flex printed circuit board.

4. The surface-conforming obscured feature detector of claim 1, further comprising a housing, and a flexible medium disposed between the housing and the sensor plates.

5. The surface-conforming obscured feature detector of claim 4, wherein the flexible medium comprises foam rubber.

6. A surface-conforming obscured feature detector configured to be placed against a curved surface to be sensed, to detect the presence of one or more features obscured by the curved surface, the detector comprising:
    a housing configured for gripping by hand;
    a plurality of flexibly interconnected sensor plates coupled to the housing, each sensor plate having a capacitance that varies based on: (a) the proximity of the sensor plate to one or more surrounding objects, and (b) the dielectric constant of the surrounding object(s);
    a first flexible substrate, supporting the sensor plates, the first flexible substrate being conformable to curvature and/or irregularities of the curved surface;
    a sensing circuit coupled to the sensor plates, the circuit being configured to measure the capacitances of the sensor plates;
    a controller coupled to the sensing circuit, the controller being configured to analyze the capacitances measured by the sensing circuit;
    one or a plurality of indicators coupled to the controller, each indicator capable of toggling between a deactivated state and an activated state, wherein the controller is configured to activate one or more of the indicators to identify a location of an obscured feature behind the curved surface.

7. The surface-conforming obscured feature detector of claim 6, wherein the first flexible substrate comprises a printed circuit board.

8. The surface-conforming obscured feature detector of claim 6, wherein the sensor plates comprise regions of metal on a flexible printed circuit board.

9. The surface-conforming obscured feature detector of claim 6, wherein the first flexible substrate is a common printed circuit board.

10. The surface-conforming obscured feature detector of claim 6, further comprising a flexible medium, disposed between the first flexible substrate and the housing.

11. The surface-conforming obscured feature detector of claim 10, wherein the flexible medium comprises foam rubber.

12. The surface-conforming obscured feature detector of claim 6, further comprising at least one sensor plate disposed upon the first flexible substrate and at least one sensor plate disposed upon a second flexible substrate.

13. The surface-conforming obscured feature detector of claim 6, wherein one or more sensor plates pivots on a hinge.

14. The surface-conforming obscured feature detector of claim 6, wherein the sensor plates comprise regions of metal on the first flexible substrate, and further comprising a first flexible medium, disposed between the first flexible substrate and the housing.

15. The surface-conforming obscured feature detector of claim 14, wherein the sensor plates further comprise regions of metal on a second flexible substrate, and further comprising a second flexible medium, disposed between the second flexible substrate and the housing.

16. The surface-conforming obscured feature detector of claim 6, wherein the housing is flexible.

17. A method of detecting an obscured feature behind a curved surface with a surface-conforming obscured feature detector having a plurality of sensor plates that are flexibly connected together in an array, the method comprising:

placing the array of sensor plates against the curved surface such that the array of sensor plates substantially conforms to the surface;

measuring the capacitance of one or a plurality of the sensor plates;

analyzing the capacitance measurements;

identifying, based on the capacitance readings, a location of the obscured feature behind the curved surface; and activating one or more indicators to indicate the location of the obscured feature behind the curved surface.

18. The method of claim 17, wherein placing the surface conforming obscured feature detector against the curved surface comprises flexing the array of sensor plates to conform to a concave or convex curvature of the surface.

* * * * *